(12) United States Patent
Witters et al.

(10) Patent No.: US 9,842,777 B2
(45) Date of Patent: Dec. 12, 2017

(54) SEMICONDUCTOR DEVICES COMPRISING MULTIPLE CHANNELS AND METHOD OF MAKING SAME

(71) Applicant: IMEC VZW, Leuven (BE)

(72) Inventors: Liesbeth Witters, Lubbeek (BE); Kurt Wostyn, Lubbeek (BE)

(73) Assignee: IMEC vzw, Leuven (BE)

( * ) Notice: Subject to any disclaimer, the term of this patent is extended or adjusted under 35 U.S.C. 154(b) by 25 days.

(21) Appl. No.: 15/199,535

(22) Filed: Jun. 30, 2016

(65) Prior Publication Data

US 2017/0025314 A1   Jan. 26, 2017

(30) Foreign Application Priority Data

Jul. 2, 2015  (EP) .................................... 15174968

(51) Int. Cl.
*H01L 21/8238* (2006.01)
*H01L 21/3065* (2006.01)
(Continued)

(52) U.S. Cl.
CPC ...... *H01L 21/823807* (2013.01); *B82Y 10/00* (2013.01); *B82Y 40/00* (2013.01);
(Continued)

(58) Field of Classification Search
CPC ......... H01L 21/823807; H01L 21/3065; H01L 27/10; H01L 27/092; H01L 29/66666;
(Continued)

(56) References Cited

U.S. PATENT DOCUMENTS 7,615,429 B2   11/2009   Kim et al.
8,183,104 B2   5/2012    Hobbs et al.
(Continued)

FOREIGN PATENT DOCUMENTS

WO   WO 2012/074872 A2   6/2012
WO   WO 2013/095341 A1   6/2013
(Continued)

OTHER PUBLICATIONS

Extended European Search Report in EU Application No. 15174968.6, dated Dec. 11, 2015, in 8 pages.

*Primary Examiner* — Dao H Nguyen
(74) *Attorney, Agent, or Firm* — Knobbe, Martens, Olson & Bear LLP

(57) ABSTRACT

The disclosed technology generally relates to semiconductor devices, and more particularly to transistor devices comprising multiple channels. In one aspect, a method of fabricating a transistor device comprises forming on the substrate a plurality of vertically repeating layer stacks each comprising a first layer, a second layer and a third layer stacked in a predetermined order, wherein each of the first, second and third layers is formed of silicon, silicon germanium or germanium and has a different germanium concentration compared to the other two of the first, second and third layers. The method additionally includes selectively removing the first layer with respect to the second and third layers from each of the layer stacks, such that a gap interposed between the second layer and the third layer is formed in each of the layer stacks. The method further includes selectively removing the second layer from each of the layer stacks with respect to the third layer, wherein removing the second layer comprises at least partially removing the second layer through the gap, thereby defining (Continued)

the channels comprising a plurality of vertically arranged third layers.

19 Claims, 4 Drawing Sheets

(51) Int. Cl.

| | | |
|---|---|---|
| *H01L 29/06* | (2006.01) | |
| *H01L 29/78* | (2006.01) | |
| *B82Y 10/00* | (2011.01) | |
| *B82Y 40/00* | (2011.01) | |
| *H01L 29/66* | (2006.01) | |
| *H01L 29/775* | (2006.01) | |
| *H01L 29/16* | (2006.01) | |
| *H01L 27/092* | (2006.01) | |
| *H01L 29/423* | (2006.01) | |
| *H01L 29/786* | (2006.01) | |

(52) U.S. Cl.
CPC ........ *H01L 21/3065* (2013.01); *H01L 27/092* (2013.01); *H01L 29/0673* (2013.01); *H01L 29/0676* (2013.01); *H01L 29/16* (2013.01); *H01L 29/42356* (2013.01); *H01L 29/42392* (2013.01); *H01L 29/66439* (2013.01); *H01L 29/66666* (2013.01); *H01L 29/775* (2013.01); *H01L 29/7827* (2013.01); *H01L 29/7849* (2013.01); *H01L 29/78696* (2013.01)

(58) Field of Classification Search
CPC ........... H01L 29/0673; H01L 29/42356; H01L 29/66439; H01L 29/775; H01L 29/7827; H01L 29/7849; H01L 29/78696; B82Y 10/00; B82Y 40/00

USPC ........... 257/29, 67, 241, 287, 686, E21.218, 257/E21.409, E21.415, E21.431, E23.082, 257/E25.006, E25.013, E27.064, E27.126, 257/E29.183, E29.189, E29.262; 438/154, 157, 258, 445, 478, 551, 694

See application file for complete search history.

(56) References Cited

U.S. PATENT DOCUMENTS

| | | | |
|---|---|---|---|
| 8,293,608 B2* | 10/2012 | Orlowski | H01L 29/42392 |
| | | | 257/183 |
| 8,753,942 B2 | 6/2014 | Kuhn et al. | |
| 9,224,808 B2* | 12/2015 | Cea | H01L 29/42392 |
| 9,564,522 B2* | 2/2017 | Cea | H01L 29/42392 |
| 9,583,491 B2* | 2/2017 | Kim | H01L 27/092 |
| 2013/0270512 A1 | 10/2013 | Radosavljevic et al. | |
| 2014/0131660 A1 | 5/2014 | Cea et al. | |
| 2015/0053928 A1 | 2/2015 | Ching et al. | |
| 2016/0118304 A1* | 4/2016 | Zang | H01L 21/82380 |
| | | | 438/694 |
| 2017/0194143 A1* | 7/2017 | Balakrishnan | H01L 21/02603 |
| 2017/0222024 A1* | 8/2017 | Bergendahl | H01L 29/66742 |
| | | | 257/347 |

FOREIGN PATENT DOCUMENTS

| | | |
|---|---|---|
| WO | WO 2013/095650 A1 | 6/2013 |
| WO | WO 2014/018201 A1 | 1/2014 |
| WO | WO 2014/051723 A1 | 4/2014 |
| WO | WO 2015/094301 A1 | 6/2015 |

* cited by examiner

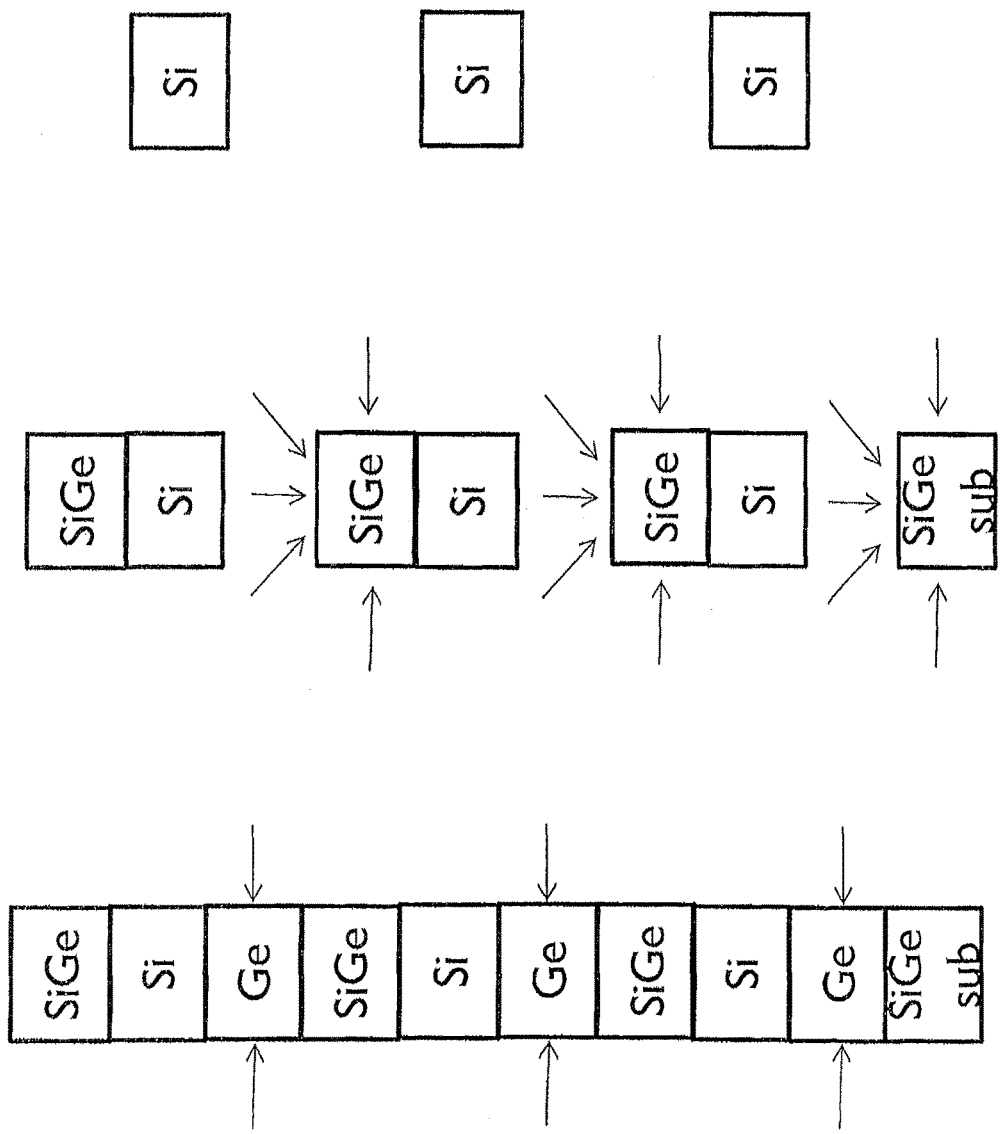

SEMICONDUCTOR DEVICES COMPRISING MULTIPLE CHANNELS AND METHOD OF MAKING SAME

CROSS-REFERENCE TO RELATED APPLICATIONS

This application claims foreign priority to European Application No. 15174968.6, filed Jul. 2, 2015, the content of which is incorporated by reference herein in its entirety.

BACKGROUND

Field

The disclosed technology generally relates to semiconductor devices, and more particularly to transistor devices comprising multiple channels, and associated complementary metal-oxide-semiconductor (CMOS) devices.

Description of the Related Technology

Moore's Law predicts a roadmap for scaling semiconductor devices in CMOS technology. In order to be able to further scale CMOS devices in the future, silicon CMOS technology is being complemented or replaced by technology based on other material systems.

Gate-all-around devices, e.g., gate-all-around transistors, comprising channel regions formed of nanowires and gates that completely surround the channel regions, have been recognized as devices that can improve various device parameters, e.g., the short channel control, at advanced nodes in order to allow continued scaling of critical dimensions, e.g., gate length.

Moreover, in order to maintain or improve drive current per chip area in a predetermined gate region having limited foot print with continued scaling, process architectures in which multiple nanowires are vertically stacked relative to one another have been proposed.

Another trend in CMOS processing, is to combine different semiconductor materials as channel materials on the same substrate, for instance, for use as NMOS and PMOS devices.

In US 2013/0270512 A1 NMOS and PMOS nanowire devices are disclosed wherein both NMOS and PMOS devices comprise a vertical stack of nanowires to achieve a greater current carrying capability (e.g. larger drive currents) for a given device footprint over a substrate. The NMOS nanowire transistor comprises group III-V semiconductor material, e.g. GaAs, while the PMOS nanowire comprises group IV semiconductor material, e.g. Germanium. In some embodiments, both NMOS and PMOS device fabrication comprises the growth of a single stack of layers wherein alternatingly a layer of a group IV semiconductor material and a layer of a group III-V semiconductor material are grown on top of each other. In an NMOS region, the group IV semiconductor layer is then selectively removed, while in a PMOS region the group III-V semiconductor layer is selectively removed.

There is a need in industry to provide alternative solutions which allow the combination of more than two different semiconductor materials as channel materials on the same substrate.

SUMMARY OF CERTAIN INVENTIVE ASPECTS

It is an aim of the present disclosure to provide a method for manufacturing a transistor device comprising multiple nanowire channels arranged above one another in a vertical stack, which allow the combination of more than two different semiconductor materials as channel materials on the same substrate.

This aim is achieved according to the disclosure with the method showing the technical characteristics of the first independent claim.

It is another aim of the present disclosure to provide an associated CMOS device.

In a first aspect of the present disclosure a method is disclosed for manufacturing a transistor device comprising multiple nanowire channels arranged above one another in a vertical stack, the method comprising providing a substrate;

growing a layer stack on said substrate in at least a first channel region, said layer stack comprising a plurality of basic layer stacks, said basic layer stack comprising a first silicon germanium layer, a second silicon germanium layer and a third silicon germanium layer in a predetermined order, the first, second and third silicon germanium layers having substantially different germanium concentrations;

selectively removing a first layer of each of said basic layer stacks, with respect to a second and a third layer of said respective stack, thereby creating gaps in said layer stack where said first layers were present before;

selectively removing a second layer of each of said basic layer stacks, with respect to said third layer, wherein said removal of said second layer occurs at least partially from within said gaps, thereby defining said nanowire channels.

In a specific embodiment, the method comprises providing a substrate;

growing a layer stack on the substrate in at least a first channel region, the layer stack comprising a plurality of basic layer stacks, the basic layer stack comprising (or consisting of) a silicon layer, a silicon germanium layer and a germanium layer in a predetermined order;

selectively removing a first layer of each of the basic layer stacks, with respect to a second and a third layer of the respective stack, thereby creating gaps in the layer stack where the first layers were present before;

selectively removing a second layer of each of the basic layer stacks, with respect to the third layer, wherein the removal of the second layer occurs at least partially from within the gaps, thereby defining the nanowire channels.

It is an advantage that three different nanowire channel materials or three different stress-state nanowire materials can be provided on the same substrate, by means of a common initial process flow.

Moreover, when the first layer of the three layers of the basic layer stacks is removed selectively, a gap is created within the stack, providing access to the second layer of the three layers of the basic layer stack. This allows a relatively quick and efficient selective removal of the second layer.

The first selective removal step and the second selective removal step may be independent steps or may comprise a single step. In case a single step is performed, e.g. a single etch step, this is such that the first layer is removed first at a much higher speed than the second layer. Once the first layer has been removed, the removal of the second layer can proceed in an accelerated manner as its upper or lower surface is then exposed to the etching substance.

According to preferred embodiments, the method may further comprise performing a recess etch creating recesses in between STI structures in a substrate, and growing the layer stack within said recesses. Alternatively, the layer stack can be grown on a blanked wafer, and can then be patterned into fin-type structures, protruding from the substrate.

According to preferred embodiments of a first type, the first layer has a relatively low germanium concentration, the second layer has a relatively average silicon germanium concentration and the third layer has a relatively high germanium concentration, and selectively removing the first layer and selectively removing the second layer comprises etching in a wet alkaline solution.

For instance, the first layer can be a silicon layer, the second layer can be a silicon germanium layer and the third layer can be a germanium layer, and selectively removing the first layer and selectively removing the second layer comprises etching in a wet alkaline solution.

The wet alkaline solution can for instance be or comprise tetramethylammonium hydroxide (TMAH), NaOH, KOH, ethylene diamine pyrocatechol (EDP) or $NH_4OH$. The germanium layer then remains as a nanowire channel.

According to preferred embodiments of a second type, the first layer has a relatively high germanium concentration, the second layer has a relatively average germanium concentration and the third layer has a relatively low germanium concentration, and selectively removing the first layer and selectively removing the second layer comprises a HCl gas phase etch, a $CF_4$ dry etch or etch with a APM.

For instance, the first layer can be a germanium layer, the second layer can be a silicon germanium layer and the third layer can be a silicon layer, selectively removing the first layer and selectively removing the second layer can comprise a HCl gas phase etch, a $CF_4$ dry etch or etch with a APM (ammonia and hydrogen peroxide mixture).

The silicon layer then remains as a nanowire channel.

According to preferred embodiments of a third type, the first layer has a relatively high germanium concentration, the second layer has a relatively low germanium concentration and the third layer has a relatively average germanium concentration, selectively removing the first layer comprises etching with $O_3$/deionised water (DIW), $O_3$HCl or $O_3/NH_4OH$, and selectively removing the second layer comprises etching in a wet alkaline solution.

For instance, the first layer can be a germanium layer, the second layer can be a silicon layer and the third layer can be a silicon germanium layer, selectively removing the first layer can comprise etching with $O_3$/deionised water (DIW) and selectively removing the second layer can comprise etching in a wet alkaline solution (for examples, see embodiments of the first type).

The silicon germanium layer then remains as a nanowire channel.

According to preferred embodiments, the method comprises
  growing a layer stack on the substrate in at least a first, as second and a third channel region, the layer stack comprising a plurality of basic layer stacks, the basic layer stack comprising a silicon layer, a silicon germanium layer and a germanium layer in a predetermined order;
  applying the method according to embodiments of the first type in the first channel region;
  applying the method according to embodiments of the second type in the second channel region;
  applying the method according to embodiments of the third type in the third channel region.

The first, second and third channel regions preferably correspond respectively to a high performance PMOS (Germanium nanowire channels), an NMOS (silicon nanowire channels) and a PMOS (SiGe nanowire channels) nanowire transistor.

According to preferred embodiments, the method comprises providing one or more gate structures provided all around the nanowire channels.

According to preferred embodiments, the predetermined order of the relatively low germanium concentration silicon germanium layer, the relatively average germanium concentration silicon germanium layer and the relatively high germanium concentration silicon germanium layer is: relatively high germanium concentration silicon germanium layer—relatively low germanium concentration silicon germanium layer—relatively average germanium concentration silicon germanium.

For instance, the predetermined order of a silicon layer, a silicon germanium layer and a germanium layer is: germanium—silicon—silicon germanium from lower layer to upper layer.

According to alternative preferred embodiments, the predetermined order of the relatively low germanium concentration silicon germanium layer, the relatively average germanium concentration silicon germanium layer and the relatively high germanium concentration silicon germanium layer is: relatively high germanium concentration silicon germanium layer—relatively average germanium concentration silicon germanium layer—relatively low germanium concentration silicon germanium layer from lower layer to upper layer.

For instance, the predetermined order of a silicon layer, a silicon germanium layer and a germanium layer is: germanium—silicon germanium—silicon from lower layer to upper layer.

According to preferred embodiments, the substrate is a strain relaxed buffer (SRB) SiGe substrate or a silicon substrate, and the germanium layers of the basic layer stacks are grown with compressive stress, the Silicon layers of the basic layer stacks are grown with tensile stress, and the SiGe layers of the basic layer stacks are grown such that they are relaxed or strained.

It is an advantage that the presence of plurality of basic layer stacks having the above stress relation, stabilizes the layer stack. Indeed, this may lead to a larger amount of strain in the layer stack and/or more wires and/or thicker wires which are suitable for being used as wire channels.

According to preferred embodiments, growing the layer stack comprises subsequently growing a plurality of basic layer stacks directly on top of one another. Preferably, the basic layer stacks are identical in constitution.

According to preferred embodiments, a single layer stack is applied over a main surface of the substrate, and is then patterned. After patterning the layer stack can still be present in the first region, or for instance in the first region, second region and third region.

In a second aspect of the present disclosure, a CMOS device is disclosed comprising at least three types of transistor devices arranged in a substrate, wherein each type of transistor device comprises multiple nanowire channels arranged above one another in a vertical stack, wherein the nanowire channels of the same type of transistor device comprise the same materials, and wherein a first type of transistor device comprises Si nanowire channels, a second type of transistor device comprises Ge nanowire channels, and a third type of transistor device comprises SiGe nanowire channels.

According to preferred embodiments, the nanowire channels of the different types of transistor devices are arranged at different, non-overlapping height ranges above the substrate. In other words, the nanowire channels of different types of transistor devices may be off-set in the height direction.

According to a further aspect of the present disclosure, the removal of a SiGe layer with a Ge concentration x with respect to a (preferably interfacing) SiGe layer with a Ge concentration y, with y>x, is performed in an alkaline solution as described before, at temperatures within the range of 70 to 90° C. Preferably, all oxidizing species are removed from the etching solution (i.e. they are not present in the etching solution), as for instance dissolved oxygen and traces of hydrogen peroxide. This will strongly limit the selective etch to the low concentration Ge layer only. It was found that if the oxidizing species are present, at these high temperatures, an isotropic or less selective etch process occurs.

This can be combined with any of the embodiments of the first aspect of the present disclosure, wherein a selective removal of a SiGe layer with a Ge concentration x with respect to a (e.g. interfacing) SiGe layer with a Ge concentration with a concentration y, with y>x is performed, for instance where a SiGe layer in the layer stack (e.g. basic layer stack) is selectively removed with respect to a Ge layer in the layer stack (e.g. basic layer stack).

Features and advantages disclosed for one of the above aspects of the present disclosure are hereby also implicitly disclosed the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

The disclosure will be further elucidated by means of the following description and the appended figures.

FIGS. 2(a) to 2(c) illustrate intermediate semiconductor structures at different process steps in a method of fabricating a device having a plurality of channels arranged in a vertical stack, according to a second embodiment of the present disclosure.

DETAILED DESCRIPTION OF CERTAIN ILLUSTRATIVE EMBODIMENTS

Figure 1C:
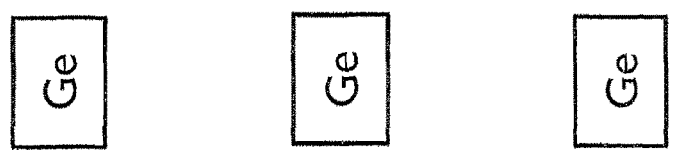
FIGS. 1(a) to 1(c) illustrate intermediate semiconductor structures at different process steps in a method of fabricating a device having a plurality of channels arranged in a vertical stack, according to a first embodiment of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the various embodiments, although referred to as "preferred" are to be construed as examples by which the disclosure may be implemented rather than as limiting the scope of the disclosure.

Gate-all-around devices on nanowires have been proposed to improve the short channel control of advanced node devices in order to allow continued gate length scaling.

In order to maintain or improve drive current per chip area with continued scaling, multiple wires have been suggested to be arranged vertically with respect to one another, e.g., in a vertical stack, while being spaced apart by respective gaps.

In an aspect of the present disclosure, a method is disclosed for fabricating tensile-strained Si wires (typically used for NMOS), strained or unstrained SiGe wires (typically used for PMOS) and compressively-strained Ge wires (typically used for high performance (HP) PMOS) on a common substrate.

More generally, a method is disclosed for fabricating tensile-strained SiGe wires (typically used for NMOS), strained or unstrained SiGe wires (typically used for PMOS) and compressive-strained SiGe wires (typically used for high performance (HP) PMOS) on a common substrate. The tensile-strained, compressive strained and unstrained SiGe wires typically have a different germanium concentration.

In various embodiments, a layer stack is grown on a substrate in at least a first channel region, where the layer stack comprises a plurality of basic layer stacks. In some embodiments, the basic layer stack includes a first layer, a second layer and a third layer stacked in a predetermined order, wherein each of the first, second and third layers is each formed of silicon, silicon germanium or germanium and has a substantially different germanium concentration. In some other embodiments, the basic layer stack comprises a first silicon germanium layer, a second silicon germanium layer and a third silicon germanium layer in a predetermined order, where each of the first, second and third silicon germanium layers has a substantially different germanium concentration, e.g., different by at least about 10%, at least about 15% or at least about 20%. For instance, one of the three silicon germanium layers has a relatively low germanium concentration, another of the three silicon germanium layers has a relatively average silicon germanium concentration and another of the three silicon germanium layers has a relatively high germanium concentration. As described herein, a relatively low germanium concentration can be silicon-rich concentration having a germanium concentration within, e.g., the closed range of 0 to 50%; a relatively average germanium concentration can be a concentration within, e.g., the closed range of 25 to 75%; a relatively high germanium concentration can be a germanium-rich concentration having a germanium concentration within, e.g., the closed range of 50 to 100%. Preferably, the relative difference in germanium concentration between any two of the three silicon germanium layers is substantially different, e.g., larger than 10% or larger than 15% or larger than 20%. The relatively average germanium concentration lies between the relatively high and the relatively low germanium concentrations.

In the examples set out below, for illustrative purposes only, the relatively low germanium concentration silicon germanium layer may be described using a silicon layer, i.e., a layer having essentially no germanium. However, it will be understood that the embodiments are not so limited, and that the concepts described are similarly applicable to silicon germanium layers having relatively low germanium concentrations, or silicon-rich silicon germanium layers. The relatively high germanium concentration silicon germanium layer is represented by a specific embodiment of being a germanium layer, i.e., a layer having essentially 100% germanium. However, it will be understood that the embodiments are not so limited, and that the concepts described are similarly applicable to silicon germanium layers having relatively high germanium concentrations, or germanium-rich silicon germanium layers.

In some embodiments of the present disclosure, explained into more detail in the paragraphs below, a SiGe strain-relaxed buffer (for instance having a Ge % concentration of the SRB ranging between 25% and 75%, more preferably between 40% to 60%, for instance of about 50%) is provided as a starting substrate layer. As described herein, a strain-relaxed layer is a layer having thickness and composition such that, due to a lattice constant mismatch to an underlying substrate, strain-relieving defects, e.g., dislocations, have formed in the layer such that the resulting lattice constant has at least partially relaxed to its natural lattice constant that is different from the underlying substrate. In contrast, a strained layer is a layer having thickness and composition such that, despite a lattice constant mismatch to an underlying substrate, strain-relieving defects, e.g., dislocations, have not substantially formed in the layer such that the resulting lattice constant is substantially strained to match a lattice constant of the underlying substrate. It will be appreciated that, without being bound to any theory, for a layer having a given composition and the associated lattice constant that is different from the underlying substrate, a critical thickness exists, which corresponds to a theoretical maximum thickness beyond which strain relaxation is energetically favoured through, e.g., dislocation formation. The SRB buffer layer can, for instance, be provided on a blanket wafer or can for instance be provided within recesses in between isolation structures, e.g., shallow trench isolation (STI) structures on a substrate.

In some embodiments, a multi-layer stack of thin layers (for instance each having thicknesses below 10 nm) comprising a tensile-strained silicon (or silicon-rich SiGe) layer, a compressive-strained germanium (or germanium-rich SiGe) layer and a relaxed or strained silicon germanium layer is grown. The different layers are provided in an alternating and repeating in regular manner, i.e. in a manner having at least one iteration of the basic layer stack. In various embodiments, the different layers are grown to a thickness at or below a critical thickness, such that no relaxation occurs and the layers remain crystalline. According to embodiments, the thickness can remain below the critical thickness, such that the layer is stable, or below a certain stability guaranteeing thickness which is larger than the critical thickness and below which the layer is stable or meta stable.

For instance, when growing a first basic layer stack, a germanium (or germanium-rich) layer can be grown on an underlying SiGe substrate layer (SRB layer), a silicon (or a silicon-rich) layer can be grown on top of the germanium (or germanium-rich) layer, and a SiGe layer can be grown on top of the underlying silicon layer. This is illustrated in FIG. 1 (a). The germanium (or germanium-rich) layers of the basic layer stacks are grown with compressive stress, e.g., without strain relaxation, the silicon (or silicon-rich) layers of the basic layer stacks are grown with tensile stress, e.g., without strain relaxation, and the SiGe layers of the basic layer stacks are grown such that they are relaxed or strained. A similar second basic layer stack can be grown on top, etc. It will be noted that a different starting layer can be applied as a starting layer of the layer stack, such that the (e.g. first) basic layer stack itself can be seen as having a different starting layer. If the initial order is respected though, the original basic layer stack will then off course be retrieved higher in the stack, when growing the layer stack by growing basic layer stacks subsequently on top of each other. The main principle of aspects of the present disclosure remains the same.

Alternatively, the basic layer stack can for instance comprise the same three layers, but in another order. Starting with a germanium (or germanium-rich) layer which is grown on an underlying SiGe substrate layer (SRB layer), a SiGe layer can be grown on top of the germanium (or germanium-rich) layer, and a Si (or silicon-rich) layer can be grown on top of the underlying SiGe layer. This results in layer stacks which are different from the layer stacks in the previous paragraph, but the main principle of aspects of the present disclosure remains the same. Also here, a different starting layer can be applied and, if the initial order is respected, the original basic layer stack will then off course be retrieved higher in the stack, when growing the layer stack by growing basic layer stacks subsequently on top of each other. The main principle of aspects of the present disclosure remains the same. These embodiments have not been illustrated.

The layer stack is then patterned, such that fin structures are defined in at least a first region. Two of the three layers of the basis layer structure are then removed selectively, in one or more processing steps, for instance by means of (isotropic or anisotropic) etching, such that only the third layers remain and form nanowire structures, which can be used as a channel structure of a respective transistor.

Different removal techniques or etching techniques can be applied, depending on the material eventually selected for the nanowire, some of which are explained below in more detail, in relation with FIGS. 1 to 3.

According to embodiments, the embodiments explained in relation with FIGS. 1 to 3 can be combined, such that, based on a common initial layer stack, different nanowires, i.e. nanowire materials are manufactured in a first, second and third region respectively.

Also, a gate can be provided all around the nanowire channels, according to embodiments. Source and drain regions and electrodes can also be provided, according to techniques known to the skilled person.

Figure 1B:
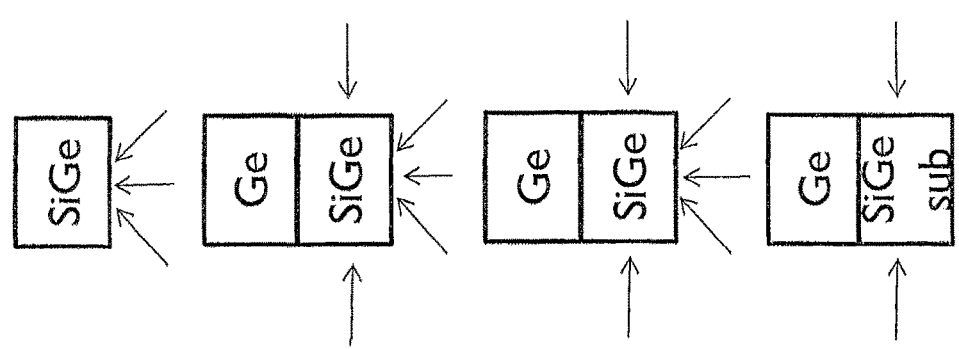
Figure 1A:
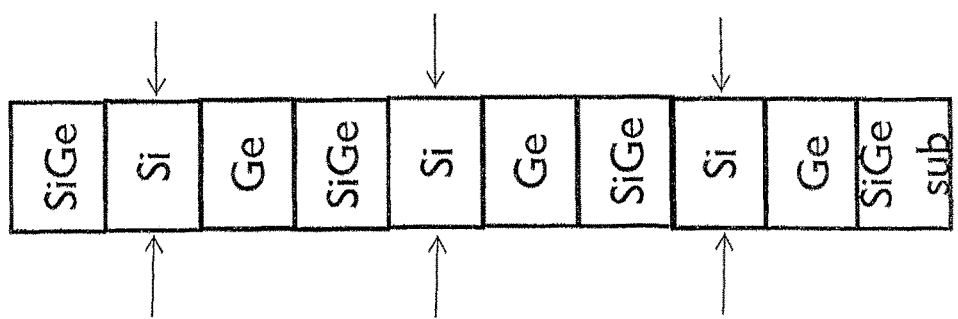

Referring to FIGS. 1(a)-1(c), according to embodiments of the first type, starting from the layer stack depicted in FIG. 1 (a), the silicon layers are selectively removed from the layer stack first (FIG. 1(b)). Hereto, etching by means of a wet alkaline solution is performed, e.g. in tetramethylammonium hydroxide (TMAH). The wet alkaline solution can, for instance, be or comprise TMAH, NaOH, KOH, ethylene diamine pyrocatechol (EDP) or NH$_4$OH. The same solution will also etch the SiGe layer, although at a slower rate, the latter depending on the concentration of Silicon in the SiGe layer. Once the silicon layer is removed, which occurs relatively quickly, the SiGe layer is exposed at its lower surface, allowing a much quicker removal of the SiGe layer as compared to the etching step which would only be acting on the sidewalls of the SiGe layer. The germanium layers then remain as nanowire channels (FIG. 1(c)).

Typically, the upper surface of the substrate whereon the layer stack is grown has a (100) orientation. The sidewall/ facets off the layers stacks can have a (110) and (111) direction respectively. The lower/upper layers of the layer stack thus have the same orientation. In such a configuration, Si will be removed first in the stack and the attack of the harder layer to remove (SiGe) can occur from the (100) plane rather from the (110) sidewall/(111) facets.

The alkaline etch rate of SiGe becomes very low (<1 nm/min) for SiGe with Ge concentrations>30% (Si %<70%). In order to selectively etch SiGe to Ge alkaline selective etch is preferably done at high temperature, for instance at temperatures within the range of 70 to 90° C. Preferably, all oxidizing species are removed from the etching solution (i.e. they are not present in the etching solution), as for instance dissolved oxygen and traces of hydrogen peroxide. This will strongly limit the selective etch to the sacrificial layers only. It was found that if the oxidizing species are present, at these high temperatures, an isotropic or less selective etch process occurs.

Referring to FIGS. 2(a)-2(c), according embodiments of the second type, starting from the layer stack depicted in FIG. 2(a) (1(a)), the germanium (or germanium-rich) layers are selectively removed from the layer stack first, as depicted in FIG. 2(b). Selectively removing the germanium (or germanium-rich) layers comprises performing, for instance, a HCl gas phase etch, a $CF_4$ dry etch or etch with a APM (ammonia and hydrogen peroxide mixture). The same solution will also etch the SiGe layer, although at a slower rate, the latter depending on the concentration of germanium in the SiGe layer. Once the germanium (or the germanium-rich) layer is removed, which occurs relatively quickly, the SiGe layer is exposed at its upper surface, allowing a much quicker removal of the SiGe layer as compared to the etching step which would only be acting on the sidewalls of the SiGe layer.

The silicon layers then remain as nanowire channels (FIG. 2(c)).

Figure 3C:
FIGS. 3(a) to 3(c) illustrates intermediate semiconductor structures at different process steps in a method of fabricating a device having a plurality of channels arranged in a vertical stack, according to a third embodiment of the present disclosure.
Figure 3B:
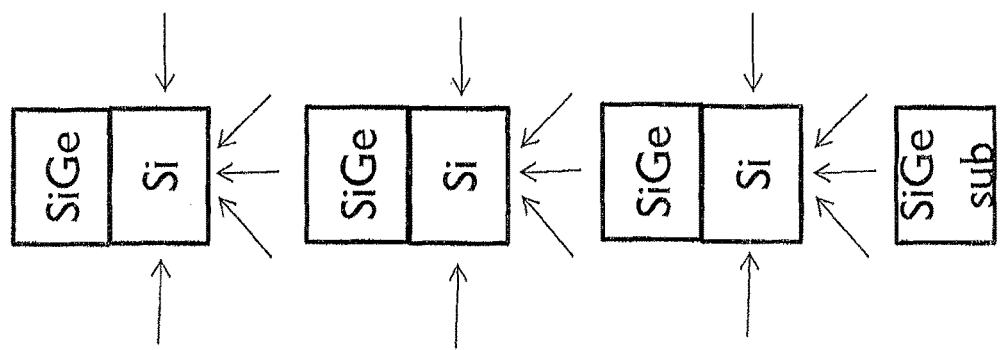
Figure 3A:
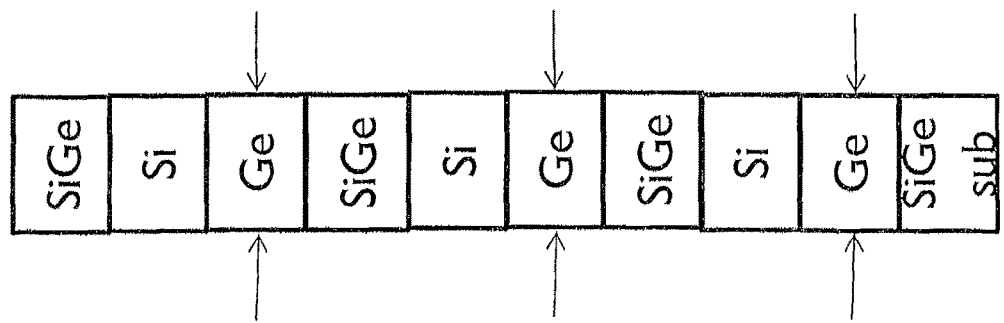

Referring to FIGS. 3(a)-3(c), according to embodiments of a third type, starting from the layer stack depicted in FIG. 3(a) (1(a), 2(a)), both the silicon (or silicon-rich) layer and the germanium (or germanium-rich) layer are selectively removed, such that the silicon germanium layers remain as nanowire channels.

First the Si can be removed, followed by the removal of the Ge layer. Alternatively, first the Ge can be removed (see FIG. 3(b)), followed by the removal of the Si layer (FIG. 3(c)).

Selectively removing the germanium layer can comprise etching with a solution of $O_3$ and deionised water (DIW) or $O_3$/HCl or $O_3$/$NH_4OH$. Selectively removing the silicon layer can comprise etching in a wet alkaline solution (for examples, see embodiments of the first type).

The silicon germanium layers then remain as nanowire channels (FIG. 3(c)).

Figure 4:
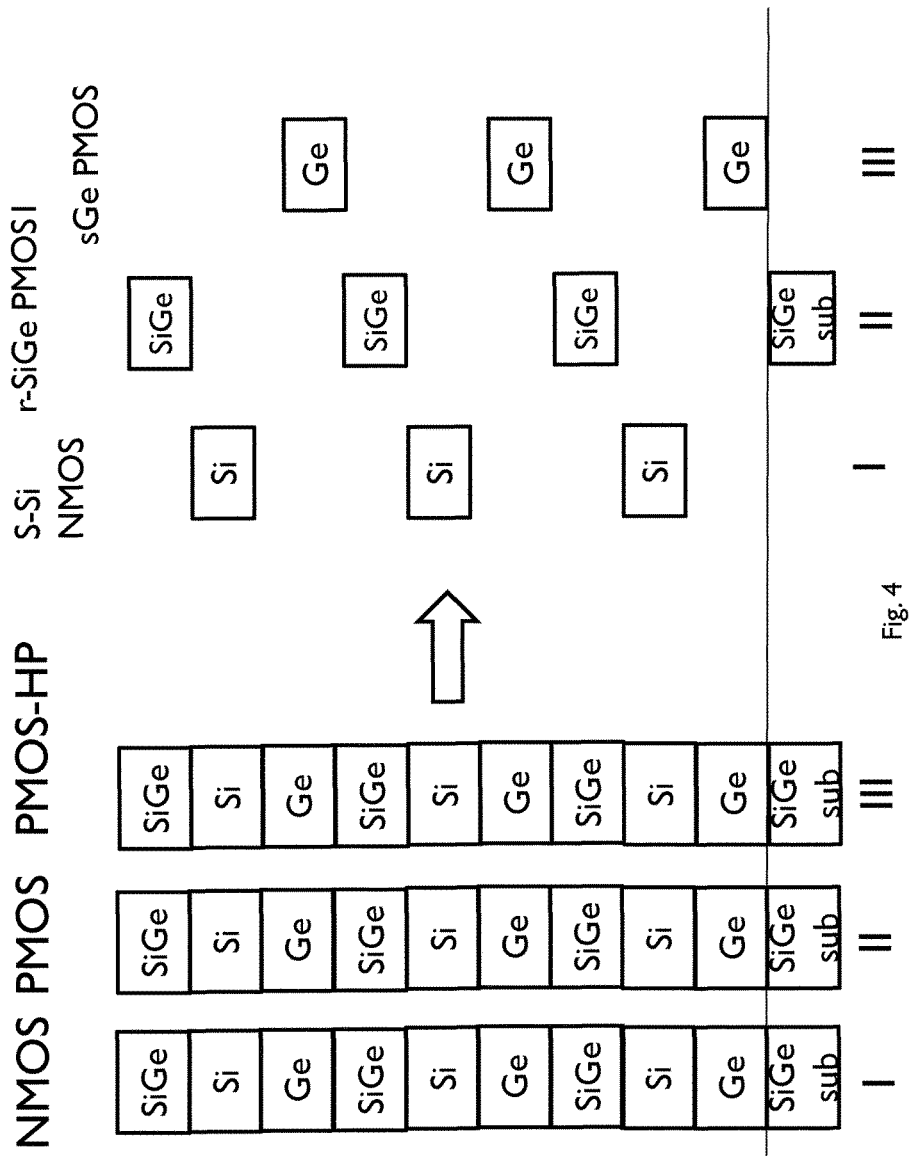
FIG. 4 illustrates intermediate semiconductor structures at different process steps in a method of fabricating a device having a plurality of channels arranged in a vertical stack, according to a fourth embodiment of the present disclosure.

In FIG. 4, a further preferred embodiment is illustrated, wherein, based on a common stack of layers, the embodiments of the first (I), second (II) and third type are applied on the same substrate (III) in respective first, second and third regions.

Appropriate masking steps may be applied in order to protect one or more of the regions when etching is performed in another region.

It is believed that a multi-layer stack of Si, SiGe and Ge layers or nanowires, co-integrated on a SRB SiGe substrate (for instance Ge %=50%) is more stable than a fully strained Ge or strained Si directly grown on such a SRB substrate.

Indeed, it is believed that tensile-strained silicon and compressive-strained Ge balance each other out in a layer stack of thin layers. This means that the fin structures made from the multistack layer are able to withstand higher thermal budgets as compared to single, relatively tall, strained Ge or strained Si fin structures.

The removal step of sacrificial layers (e.g. two out of three layers of a basic layer stack) in the layer stack can be based on an isotropic process or an anisotropic process. In case anisotropic processes are used, it is preferred to take into account the crystal plane orientations, as the anisotropic process/etching is also dependent on the crystal plane. The skilled person will recognise that taking into account the crystal plane orientations of course needs to be consistent with final device requirements.

For example, Si and SiGe have shown anisotropic etch behaviour in wet alkaline solutions. In alkaline solutions, the etch rate of Si (001) and (110) crystal planes are much higher than the (111) and planes. For the case of SiGe the etch rates of the (100), (110) and (111) crystal planes are of the same order of magnitude, with the (110) crystal plane having the lowest etch rate.

Further, e.g., Si and SiGe also show anisotropic etch behaviour during HCl gas phase etching. The etch rate of (100) crystallographic planes is higher compared to the (110) crystal planes.

Anisotropic selective etch chemistries behave differently for convex (outward) and concave (inward) corners. During anisotropic etching the etch rate of convex corners is determined by the crystallographic plane with the highest etch rate while the etch rate of concave corners is determined by the crystallographic plane with the lowest etch rate. Anisotropic selective etching thus forms concave corners in the sacrificial layer. The remaining nanowire has convex shape. The etch selectivity is then also determined by the slowest etching plane of the sacrificial layer versus the fastest etch rate of the nanowire.

By application of the nanowire stack as proposed in embodiments of the present disclosure, the selective etch is made 'easier' by the implementation of two sacrificial layers within the stack. The hardest-to-remove sacrificial layer will have convex corners, as well as the remaining nanowire layer.

An appropriate etch selectivity can thus be then determined by comparing the crystal planes with the highest etch rates, both for the sacrificial layer and nanowire.

Selective etch can also be done using isotropic selective etch chemistries, e.g. using formulated chemistries. By splitting up the sacrificial layer into different layers, the hardest-to-remove sacrificial layer will be etched from three directions as compared to two for a single sacrificial layer. This should reduce the required etch time and so increases the selectivity of the selective removal step.

Aspects of the present disclosure provide various advantages.

It is an advantage that combining the compressive Ge and tensile Si in a multi-layer stack as disclosed stabilizes the layer stack, allowing larger amount of strain and/or more wires and/or thicker wires.

It is a further advantage that, in a multi-layer stack as disclosed, one of the layers can serve as a sacrificial layer, making the selective etch of SiGe towards the other layer easier/shorter. For example, using TMAH as selective etch of SiGe to Ge, Silicon can be very easily etched out, giving more easy access for the selective etch chemical towards SiGe removal. Similar advantage can also be applied for selective etch of SiGe towards Silicon (e.g. using HCl vapor etch will remove Ge very fast, thus allowing isotropic SiGe etch by HCl from 3 sides rather than left/right site of the stack only.

It is an even further advantage that, having the three different nanowire channel materials, allows combination of Si channel transistors (in this case the Si material can be used for NMOS transistors, either High Performance or Low Power applications), SiGe channel transistors (PMOS, Low Power application) and Ge channel transistors (PMOS, High Performance application) on a single, common substrate.

The foregoing description details certain embodiments of the disclosure. It will be appreciated, however, that no matter how detailed the foregoing appears in text, the disclosure may be practiced in many ways.

While the above detailed description has shown, described, and pointed out novel features of the invention as applied to various embodiments, it will be understood that various omissions, substitutions, and changes in the form and details of the device or process illustrated may be made by those skilled in the technology without departing from the disclosure.

What is claimed is:

1. A method of fabricating a transistor device comprising a plurality of channels arranged in a vertical stack, the method comprising:
    providing a substrate;
    forming on the substrate in at least a first channel region a plurality of vertically repeating layer stacks, each of the layer stacks comprising a first layer, a second layer and a third layer stacked in a predetermined order, wherein each of the first, second and third layers is formed of silicon, silicon germanium or germanium and has a different germanium concentration compared to the other two of the first, second and third layers;
    selectively removing the first layer with respect to the second and third layers from each of the layer stacks, such that a gap interposed between the second layer and the third layer is formed in each of the layer stacks; and
    selectively removing the second layer with respect to the third layer from each of the layer stacks, wherein removing the second layer comprises at least partially removing the second layer through the gap, thereby defining the channels comprising a plurality of vertically arranged third layers.

2. The method according to claim 1, wherein the first layer has a relatively low germanium concentration, the third layer has a relatively high germanium concentration higher than the low germanium concentration, and the second layer has a germanium concentration between the relatively low germanium and the relatively high germanium concentration, wherein selectively removing the first layer and selectively removing the second layer each comprises etching in a wet alkaline solution.

3. The method according to claim 2, wherein the wet alkaline solution comprises one or more selected from the group consisting of tetramethylammonium hydroxide (TMAH), NaOH, KOH, ethylene diamine pyrocatechol (EDP) and $NH_4OH$.

4. The method according to claim 1, wherein the first layer has a relatively high germanium concentration, the third layer has a relatively low germanium concentration lower than the relatively high germanium concentration, and the second layer has germanium concentration between the relatively low germanium concentration and the relatively high concentration, and wherein selectively removing the first layer and selectively removing the second layer each comprises dry etching using a gas mixture comprising HCl, dry-etching using a gas mixture comprising $CF_4$ or wet-etching in a solution comprising a mixture of ammonia and hydrogen peroxide (APM).

5. The method according to claim 1, wherein the first layer has a relatively high germanium concentration, the second layer has a relatively low germanium lower than the relatively high germanium concentration and the third layer has a germanium concentration between the relatively low germanium concentration and the relatively high germanium concentration, and wherein selectively removing the first layer comprises etching using a solution of $O_3$ and deionized water (DIW), a solution of $O_3$ and HCl or a solution of $O_3$ and $NH_4OH$, and wherein selectively removing the second layer comprises etching in a wet alkaline solution.

6. The method according to claim 1, wherein forming the plurality of vertically repeating layer stacks comprises growing in at least the first channel region, a second channel region and a third channel region, wherein each the plurality of vertically repeating layer stacks comprises a silicon layer, a silicon germanium layer and a germanium layer in a predetermined order, wherein the method further comprises:
    applying the method according to claim 2 in the first channel region;
    applying the method according to claim 4 in the second channel region; and
    applying the method according to claim 5 in the third channel region.

7. The method according to claim 1, further comprising providing one or more gate structures surrounding the channels.

8. The method according claim 1, wherein each of the vertically repeating layer stacks comprises:
    the third layer formed on the substrate, the third layer having a relatively high germanium concentration;
    the first layer formed on the third layer, the first layer having a relatively low germanium concentration lower than the relatively high germanium concentration; and
    the second layer formed on the first layer, the second layer having a germanium concentration between the relatively high germanium concentration and the relatively low germanium concentration.

9. The method according to claim 8, wherein the substrate is a strain relaxed buffer (SRB) SiGe substrate or a silicon substrate, and wherein each of the first to third layers has a thickness and a composition such that, as formed, the third layer is compressive-strained, the first layer is tensile-strained and the second layer is strain-relaxed or strained.

10. The method according to claim 1, wherein each of the vertically repeating layer stacks comprises:
    the third layer formed on the substrate, the third layer having a relatively high germanium concentration;
    the first layer formed over the third layer, the first layer having a relatively low germanium concentration lower than the relatively high germanium concentration; and
    the second layer interposed between the first layer and the third layer, the second layer having a germanium concentration between the relatively high germanium concentration and the relatively low germanium concentration.

11. The method according to claim 1, wherein forming the plurality of vertically repeating layer stacks includes growing one layer stack directly on another layer stack.

12. A CMOS device comprising at least three types of transistor devices arranged in a substrate, wherein each type of transistor devices comprises multiple nanowire channels arranged in a vertical stack, wherein the nanowire channels of the same type of transistor devices comprise the same materials, and wherein a first type of transistor devices comprises Si nanowire channels, a second type of transistor devices comprises Ge nanowire channels, and a third type of transistor devices comprises SiGe nanowire channels.

13. The CMOS device according to claim 12, wherein the nanowire channels of the different types of transistor devices are arranged at different, non-overlapping height ranges above the substrate.

14. A method of fabricating a semiconductor device, comprising:
providing a substrate;
forming a plurality of vertically repeating layer stacks each comprising a first layer, a second layer and a third layer, wherein each of the first, second and third layers is formed of silicon, silicon germanium or germanium and has a germanium concentration different from the other two of the first, second and third layers;
selectively removing the first layer from each of the layer stacks such that a gap interposed between the second layer and the third layer is formed; and
selectively removing the second layer from each of the layer stacks, such that a plurality of vertically arranged third layers are formed.

15. The method of claim 14, wherein selectively removing the first layer comprises completely removing the first layer, and wherein selectively removing the second layer comprises completely removing the second layer after the first layer is completely removed.

16. The method of claim 15, wherein one of the first, second and third layers has a germanium concentration between about 25% and about 75%, and each of the others of the first, second and third layers has a germanium concentration that is different by at least 10%.

17. The method of claim 16, wherein forming the plurality of vertically repeating layer stacks comprises forming a germanium-rich SiGe layer contacting the substrate, a silicon-rich SiGe layer contacting the germanium-rich SiGe layer and a SiGe layer having a germanium concentration between about 25% and about 75% contacting the germanium-rich SiGe layer.

18. The method of claim 17, wherein the substrate comprises a strain-relaxed buffer layer, and wherein forming the layer stacks comprises forming the germanium-rich SiGe layer and the silicon-rich SiGe layer each having a thickness smaller than a respective critical thickness for strain relaxation such that as-grown, each of the germanium-rich SiGe layer and the silicon-rich SiGe layer is fully strained.

19. The method of claim 17, wherein forming the plurality of vertically repeating layer stacks comprises forming a germanium layer contacting the substrate, a silicon layer contacting the germanium layer and a SiGe layer having a germanium concentration between about 25% and about 75% contacting the germanium layer.

* * * * *

UNITED STATES PATENT AND TRADEMARK OFFICE
CERTIFICATE OF CORRECTION

PATENT NO. : 9,842,777 B2
APPLICATION NO. : 15/199535
DATED : December 12, 2017
INVENTOR(S) : Liesbeth Witters et al.

Page 1 of 1

It is certified that error appears in the above-identified patent and that said Letters Patent is hereby corrected as shown below:

In the Claims

In Column 12 at Line 31, In Claim 8, change "according" to --according to--.

In Column 12 at Line 48, In Claim 10, change "according" to --according to--.

Signed and Sealed this
Seventeenth Day of April, 2018

Andrei Iancu
*Director of the United States Patent and Trademark Office*